United States Patent [19]

Yoshikawa

[11] Patent Number: 4,885,261

[45] Date of Patent: Dec. 5, 1989

[54] METHOD FOR ISOLATING A SEMICONDUCTOR ELEMENT

[75] Inventor: Kuniyoshi Yoshikawa, Tokyo, Japan

[73] Assignee: Kabushiki Kaisha Toshiba, Kawasaki, Japan

[21] Appl. No.: 320,817

[22] Filed: Mar. 10, 1989

Related U.S. Application Data

[63] Continuation of Ser. No. 140,649, Jan. 4, 1988, abandoned.

[30] Foreign Application Priority Data

Jan. 13, 1987 [JP] Japan .................................. 62-5821

[51] Int. Cl.⁴ ............................................ H01L 21/08

[52] U.S. Cl. .................................. 437/228; 437/981; 437/978; 437/61; 437/238; 156/653

[58] Field of Search ............... 437/228, 238, 239, 240, 437/61, 241, 63, 64, 981, 978; 156/653, 643, 657

[56] References Cited

U.S. PATENT DOCUMENTS 4,354,896 10/1982 Hunter ................................ 437/233
4,667,395 5/1987 Ahlgren et al. .................... 437/228

OTHER PUBLICATIONS

White, L. K., "Bilayer Taper Etching" J. Electrochem Soc., vol. 127, No. 12, 1980, pp. 2687–93.

*Primary Examiner*—Olik Chaudhuri
*Assistant Examiner*—Kevin McAndrews
*Attorney, Agent, or Firm*—Finnegan, Henderson, Farabow, Garrett and Dunner

[57] ABSTRACT

According to the invention, on a silicon substrate is formed an insulation silicon oxide film with the etching rate thereof increasing as one goes away from the substrate, on the insulation silicon oxide film is formed a first silicon nitride film defining the width of the element isolation region, the insulation silicon oxide film is provided with a slope by isotropic etching with the first silicon nitride film as mask, and a lower portion of the insulation silicon oxide film is isotropically etched, with the sloped portion of the insulation silicon oxide film being masked by a second silicon nitride film.

13 Claims, 3 Drawing Sheets

16 20 18 15 12 14 11

18 15 16 20 E2 E1 12 14 11

21 16 15 12 14 11

METHOD FOR ISOLATING A SEMICONDUCTOR ELEMENT

This application is a continuation of application Ser. No. 140,649, filed Jan. 4, 1988, now abandoned.

BACKGROUND OF THE INVENTION

This invention relates to a method of manufacturing a semiconductor device and particularly to a method of semiconductor element isolation.

Heretofore, a technique of local oxidation of silicon (or so-called LOCOS technique) is well known in the art as element isolation technique. In the LOCOS technique, manufacturing processes are carried out as follows. An oxidization-resisting film, e.g., a silicon nitride ($Si_3N_4$) film is formed over a semiconductor substrate interposing an insulation film. Then, the silicon nitride film is patterned and selective oxidization of the insulation film is performed using patterned silicon nitride film and as a result, a thick insulation film for element isolation is obtained.

By adopting the LOCOS technique, an error is produced between the size of the selective oxidization mask material (silicon nitride film) and the size of the formed element isolation region due to a phenomenon known as bird's beak, i.e., growth of the oxide film in the lateral direction. For example, if the thickness of the silicon nitride film is 2,500 Å, the thickness of the insulation film (i.e., silicon oxide film) between the semiconductor substrate (silicon substrate) and silicon nitride film is 1,500 Å, the thickness of the element isolation insulation film at the time of the selective oxidization is 8,000 Åand the thickness of the finished element isolation film is 5,000 to 6,000 Å, the size error is 1.2 to 1.6 μm.

Due to this size error, in the case of adopting the LOCOS technique, it is difficult to form the element isolation region having the width of the practical element isolation region less than approximately 20 μm. Consequently, the LOCOS technique is not suited for the formation of an element isolation insulation film having a size in the transverse direction less than 2 μm.

Further, in the LOCOS technique, an impurity is introduced by means of ion implantation in order to prevent conduction of parasitic transistor in the element isolation region. The impurity subsequently migrates into the active element transistor portion when the element isolation insulation film is formed (usually by thermal oxidization). That is, it leads to a narrow channel effect, thereby degrading the electrical characteristics of the element.

Further, with the LOCOS technique, the thickness of the element isolation insulation film is reduced when the gap size of the mask material for selective oxidization is reduced.

Concerning the problem of the size error noted above, this problem can be solved by setting the size of the selective oxidization mask material by preliminarily taking the size errors into considerations. In this case, however, the formation of the mask material becomes difficult. Besides, the manufacturing precision is deteriorated. Moreover, this process does not solve the problem of forming a fine element isolation insulation film.

Further, as a method for reducing the size error, it is thought to form a groove in the semiconductor substrate or remove or make extremely thin the insulation film of the lowermost layer in the LOCOS technique. These methods, however, have a problem that crystal defects are produced in the semiconductor substrate when the element isolation region is formed.

As shown above, the LOCOS technique, which has been used for forming the element isolation region, has the problems that an error is produced between the size of the mask material for selective oxidization and the size of the formed element isolation region, that a narrow channel effect is produced with the migration of the impurity and that the thickness of the element isolation region is reduced upon a reduction of the size of the region.

SUMMARY OF THE INVENTION

An object of the invention is to provide a semiconductor device manufacturing method which permits an element isolation region of a desired size to be readily obtained, without giving rise to crystal defects, and which also prevents the occurrence of the narrow channel effect and a reduction in the thickness of the element isolation region upon a reduction of the size thereof.

According to the invention, a method is provided which comprises a step of forming on a semiconductor substrate an insulation film the etching rate of which increases as the etching proceeds away from the substrate, a step of forming on the insulation film a first mask material for defining the size of the element isolation region, a step of isotropically etching the upper region of the insulation film, using as a mask the first mask material film, and a step of isotropically etching the lower region of the insulation film, with the aforementioned etched portion being masked by a second mask material film.

According to the present invention, a rough shape of the element isolation region is formed by a first isotropic etching step, and, as a result of a second isotropic etching process, the size of the element isolation region is matched to the size defined by the first mask material film by making use of the conversion difference of the second mask material film.

BRIEF DESCRIPTION OF THE DRAWINGS

FIG. 1 is a view showing that a surface protective silicon oxide film is formed on a silicon substrate and then a field inversion prevention impurity layer is formed in the surface protective silicon oxide film;

FIG. 2 is a view showing that an insulation silicon oxide film is formed on the surface protective silicon oxide film formed in the step of FIG. 1 and then a damage layer is formed in the insulation silicon oxide film;

FIG. 3 is a view showing that a first silicon nitride film is formed on the insulation silicon oxide film formed in the step of FIG. 2;

FIG. 4 is a view showing that a photoresist film is formed on the first silicon nitride film, formed in a step of FIG. 3, and is then patterned to a predetermined pattern;

FIG. 5 is a view showing that the first silicon nitride film is etched by isotropic etching with the photoresist film patterned in the step of FIG. 4 as mask, while the damage layer formed on the insulation silicon oxide film is etched;

FIG. 6 is a view showing that the insulation silicon oxide film is etched by isotropic etching with the photoresist film and first silicon nitride film as masks;

FIG. 7 is a view showing that a second silicon nitride film is formed over the entire surface of the wafer after removing the photoresist film;

FIG. 8 is a view showing that the second silicon nitride film is etched by anisotropic etching, then the insulation silicon oxide film is successively etched by anisotropic etching, and the surface protective silicon oxide film is etched to a predetermined thickness;

FIG. 9 is a view showing that the insulation silicon oxide film and surface protective silicon oxide film, followed by the first and second silicon nitride films, are etched by isotropic etching.

DETAILED DESCRIPTION OF THE PREFERRED EMBODIMENTS

The embodiment of the invention will now be described in detail, with reference to the accompanying drawings.

Figure 1:
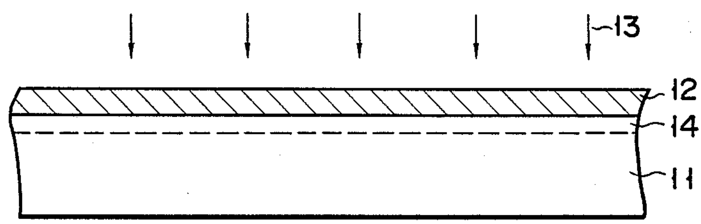
FIGS. 1 to 9 illustrate semiconductor device manufacturing method according to the invention.

As is shown in FIG. 1, silicon substrate 11 of p-conductivity type (Miller index 100) and with a resistivity of 10 to 20 Ω·cm, is oxidized by thermal oxidization at 950° C., thereby to form surface protection silicon oxide film ($SiO_2$ film) 12 having a thickness of 1,000 Å. Thereafter, boron 13 is ion implanted under conditions of 60 keV and $3\times10^{12}$ cm$^{-2}$, whereby field inversion prevention impurity layer 14 is formed.

Figure 2:
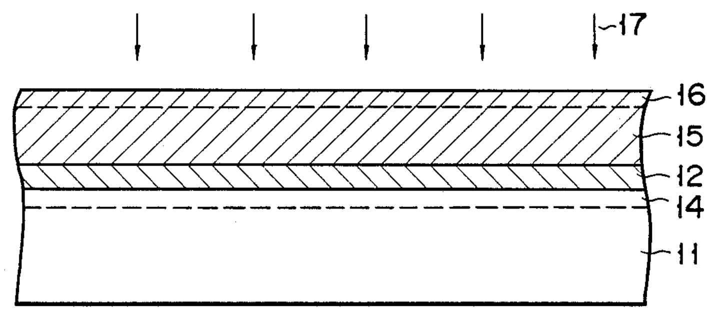

Next, as is shown in FIG. 2, insulation silicon oxide film ($SiO_2$ film) 15 having a thickness of 3,500 Åis formed by use of the CVD process, and densifying the film 15 is conducted in an $N_2$ gas atmosphere at 900° C., to render silicon oxide film 12 equal in its refractivity and etching rate to silicon oxide film 15. Thereafter, As ions 17 are ion implanted under conditions of 40 keV and $1\times10^{15}$ cm$^{-2}$, thereby forming damage layer 16 on the surface of silicon oxide film 15 on the side opposite silicon substrate 11.

Figure 3:
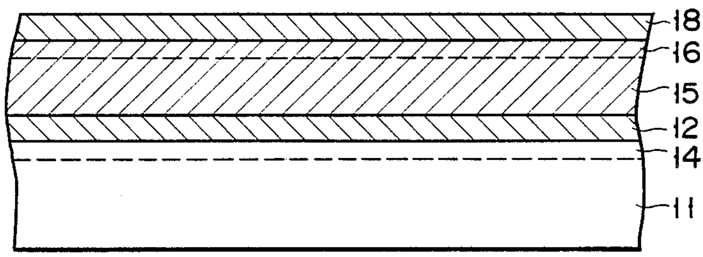
Figure 4:
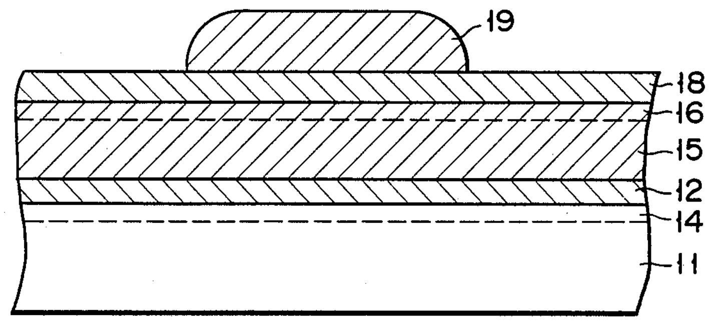
Figure 5:
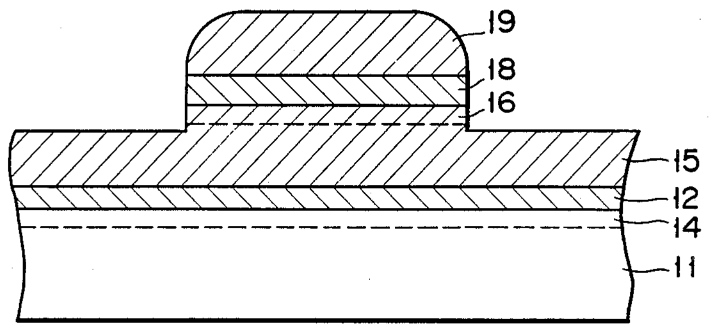

Next, as is shown in FIG. 3, first silicon nitride film ($Si_3N_4$ film) 18 having a thickness greater than 1,000 Å—for example, 1,500 Å—is deposited by use of the CVD process. Then, as is shown in FIG. 4, film 18 has photoresist film 19 is formed thereon and patterned by photoetching. Referring now to FIG. 5, silicon nitride film 18 and silicon oxide film 15 are then anisotropically etched, with photoresist film 19 being used as mask. Silicon oxide film 15 is removed by a thickness of 3,500 Å among the total thickness of 1,000 to 1,500 Åto leave the a thickness of 2,500 to 3,000 Å. That is, damage layer 16 is removed over all portion thereof not covered by photoresist film 19. The size in the lateral direction of silicon nitride film 18 formed by means of the anisotropic etching step defines the size of the element isolation region, as will be described later.

Figure 6:
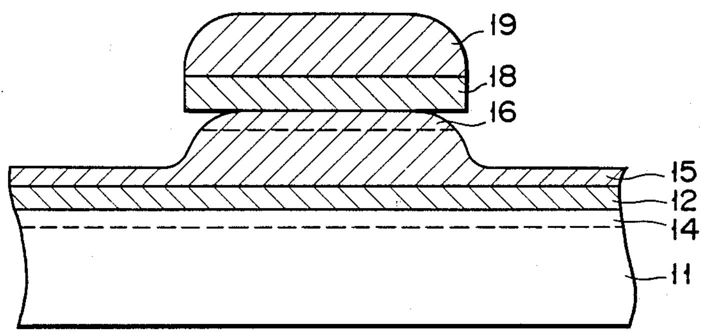
Figure 7:
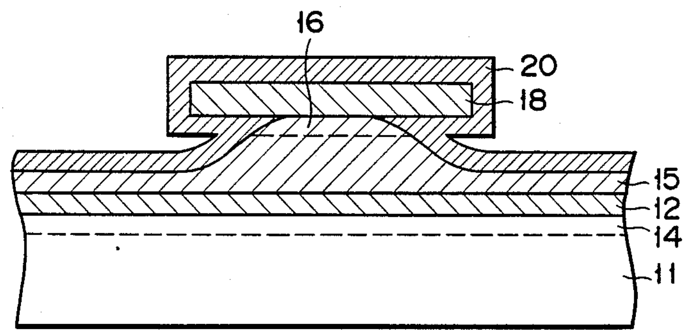
Figure 8:
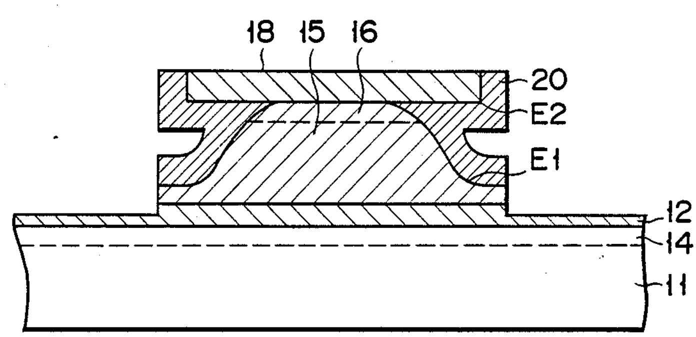

Next, as is shown in FIG. 6, a first isotropic etching step is performed to etch silicon oxide film 15 to leave a thickness thereof amounting to 1,000 to 1,500 Å, thus leaving silicon oxide film 15 with a thickness of 2,000 to 2,500 Åon silicon substrate 11. As a result of this isotropic etching, silicon oxide film 15 now has a predetermined slope. This results from the fact that surface region of film 15 on which damage layer 16 remains has an etching rate higher than the other surface regions of film 15. Upon completion of the isotropic etching step, photoresist 19 is removed, as is shown in FIG. 7, after which second silicon nitride film 20, having a thickness of 1,000 to 1,500 Å, is deposited over the entire surface by use of the CVD process. Then, as is shown in FIG. 8, silicon nitride film 20 is anisotropically etched, and silicon nitride film 18 is partly etched by the etch-back. Insulation film 15 and silicon oxide film 12 are also anisotropically etched, so as to leave silicon oxide film 12 with a thickness of 500 to 1,000 Å on silicon substrate 11.

Figure 9:
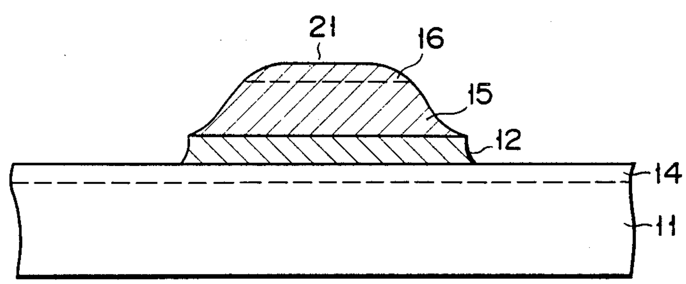

Next, as is shown in FIG. 9, a second isotropic etching step is performed so as to remove end portions of insulation film 15 and silicon oxide film 12 and thereby expose silicon substrate 11. Finally, silicon nitride films 18 and 20 are removed by isotropic etching. By the process described above, element isolation region 21 is formed. Afterwards, a semiconductor element, e.g., a MOS transistor or a bipolar transistor, is formed by a well-known manufacturing process in each active region isolated by element isolation region 21.

As has been described in the foregoing, in the above embodiment element isolation region 21 is formed by etching, so that it is possible to make the size of the element isolation region coincide with a size defined by the lateral size of silicon nitride film 18. It is thus possible to form a fine element isolation region with a size of 2 μm or less.

Since the etching step is performed isotropically twice, it is possible to effect etching control for prevention of overetching or the like in two steps, so that high accurate etching control can be readily effected.

Since element isolation region 21 is set to size using silicon nitride film 20 at the time of the second isotropic etching, a predetermined size can be obtained readily and accurately. More specifically, size errors result when removing silicon oxide film 12 from the state shown in FIG. 8 by isotropic etching. In this embodiment, a positive conversion difference is provided sidewise of silicon nitride film 18 to an extent corresponding to a thickness of 1,000 to 1,500 Å of silicon nitride film 20 sidewise of silicon nitride film 18. It is thus possible to control the second isotropic etching time such as to match edge El of element isolation region 21 with edge E2 of silicon nitride film 18 at the instant of the completion of etching.

Since element isolation region 21 is given a slope by making use of the etching rate difference by forming damage layer 15 on silicon nitride film 15, it is possible to prevent generation of breakage of leads or like accidents. Likewise, since the second etching is done as isotropic etching, it is possible to give element isolation region 21 a slope in the neighborhood of the boundary with silicon substrate 11 for enhancing the effect of prevention of generation of such accidents as breakage of leads.

Since the portion formed as a result of the first isotropic etching step is masked by silicon nitride film 20 at the time of the second isotropic etching, the second isotropic etching can be performed without possibility of a change in the shape of the portion formed as a result of the first isotropic etching.

In this embodiment, after the formation of field inversion prevention impurity layer 14, silicon oxide film 15 and silicon nitride film 18 are formed by the CVD process, so that it is possible to prevent generation of a narrow channel effect.

In this embodiment a long oxidization step, which results in crystal defects, is not performed.

In this embodiment the element isolation region is formed by etching. Therefore, the film thickness is not reduced even when the size of the region is reduced.

The above embodiment of the invention is by no means limitative. For example, the same effects as in the above embodiment can of course be obtained by removing, prior to the second isotropic etching, first and second silicon oxide films 12 and 15 by anisotropic etching with first and second silicon nitride films 18 and 20 as mask. In this case, however, first silicon oxide film 12 is left to an extent corresponding to 100 Å or above.

While in the above embodiment the insulation film has been a mono-layer film with damage layer 16 formed by ion implantation in silicon oxide film 15 formed by the CVD process, the same effects may be obtained using a laminated film consisting of a silicon oxide film and phosphorus glass film formed by the CVD process.

As the first and second mask material films it is possible to use a polysilicon film as well as silicon nitride films 18 and 20.

While in the above embodiment the first isotropic etching is performed in order to leave the silicon oxide film to an extent of 2,000 to 2,500 Å on silicon substrate 11, it is of course possible to leave the film thereon to an extent more than 2,500 Å.

The thickness of second silicon nitride film 20 is not limited to the range of 1,000 to 1,500 Å; its thickness may range from, for example, 500 to 3,000 Å.

While the above embodiment of the invention relates to the manufacture of an N-type MOS semiconductor device, the invention is also applicable to the manufacture of such semiconductor devices as those of P-type MOS and CMOS.

As has been described in the foregoing, the semiconductor manufacturing method according to the invention permits an element isolation region of a desired size to be readily obtained, without giving rise to crystal defects, and also prevents the occurrence of the narrow channel effect and a reduction in the thickness of the element isolation region upon a reduction of the size thereof.

What is claimed is:

1. A method for isolation of a semiconductor element in a semiconductor device comprising:

- a step of forming a surface protective film on a semiconductor substrate;
- a step of forming an insulation film on said surface protective film;
- a step of forming a first mask material film on said insulation film;
- a step of selectively removing said first mask material film at an area thereof equal to a width of an element isolation region;
- a step of isotropically etching said insulation film to produce a sloped portion of said insulation film immediately underneath said first mask material film with a rising edge portion of said sloped portion being aligned in a vertical direction with an edge portion of said first mask material film;
- a step of forming a second mask material film over the entire surface;
- a step of anistropically etching said second mask material film;
- a step of isotropically etching said insulation film and said surface protective film, to expose said semiconductor substrate; and
- a step of removing said first mask material film and said second mask material film by means of anisotropic etching.

2. The method according to claim 1, wherein the etching rate of said insulation film increases as the etching proceeds away from said semiconductor substrate.

3. The method according to claim 2, wherein said insulation film includes a damage layer formed by implanting ions into the surface portion of the insulation film so that the etching rate of the damage layer is higher than that of the other portion of the insulation film.

4. The method according to claim 1, wherein said insulation film is a silicon oxide film.

5. The method according to claim 2, wherein said insulation film consists of a lamination of a plurality of layers having different etching rates.

6. The method according to claim 5, wherein said plurality of layers having different etching rates consist of a phosphorus glass layer and a silicon oxide layer.

7. The method according to claim 1, wherein said surface protective film is a silicon oxide film.

8. The method according to claim 1, wherein said first mask material film is a silicon nitride film.

9. The method according to claim 1, wherein said second mask material film is a silicon nitride film.

10. The method according to claim 1, wherein said first mask material film is a polysilicon film.

11. The method according to claim 1, wherein said second mask material film is a polysilicon film.

12. The method according to claim 1, wherein a step of anisotropically etching said insulation film and said surface film is interposed between the step of anisotropically etching said second mask material film and the step of isotropically etching said insulation film and said surface protective film.

13. The method according to claim 1, wherein said second mask material film is thicker than said insulation film and surface protective film which are isotropically etched.

* * * * *